(12) United States Patent
Yamaguchi

(10) Patent No.: US 7,736,158 B2
(45) Date of Patent: Jun. 15, 2010

(54) ELECTRICAL JUNCTION BOX WITH A DECREASED HEIGHT SIZE AND WATERPROOF FUNCTION

(75) Inventor: Jun Yamaguchi, Yokkaichi (JP)

(73) Assignee: Sumitomo Wiring Systems, Ltd., Mie (JP)

( * ) Notice: Subject to any disclaimer, the term of this patent is extended or adjusted under 35 U.S.C. 154(b) by 0 days.

(21) Appl. No.: 12/289,690

(22) Filed: Oct. 31, 2008

(65) Prior Publication Data

US 2009/0117758 A1 May 7, 2009

(30) Foreign Application Priority Data

Nov. 7, 2007 (JP) .............................. 2007-289739

(51) Int. Cl.
*H01R 12/00* (2006.01)

(52) U.S. Cl. ...................... 439/76.2; 439/587; 439/271; 439/276

(58) Field of Classification Search ................ 439/76.2, 439/587, 271, 276
See application file for complete search history.

(56) References Cited

U.S. PATENT DOCUMENTS

| 5,777,850 | A  | * | 7/1998  | Jakob et al. .................. 361/736 |
| 6,573,448 | B2 | * | 6/2003  | Mayer et al. ................. 174/481 |
| 6,911,598 | B2 | * | 6/2005  | Onizuka et al. ............... 174/50 |
| 7,035,105 | B2 | * | 4/2006  | Yamaguchi .................. 361/707 |
| 7,233,495 | B2 |   | 6/2007  | Tomikawa et al. |
| 2004/0235317 | A1 | * | 11/2004 | Schiefer .................... 439/76.2 |

FOREIGN PATENT DOCUMENTS

JP A-2005-80370 3/2005

\* cited by examiner

*Primary Examiner*—Tho D Ta
(74) *Attorney, Agent, or Firm*—Oliff & Berridge, PLC

(57) ABSTRACT

An electrical junction box comprising a casing body including a bottom wall and a side wall extending upward from the bottom wall; a circuit board contained in the casing body; a connector housing disposed in a cutout section in the side wall and adapted to be coupled to a mating member; a filler filled in a space enclosed by the bottom wall, side wall and connector housing; and a packing disposed in a clearance between the cutout section and an outer peripheral surface of the connector housing to seal the clearance.

17 Claims, 8 Drawing Sheets

ELECTRICAL JUNCTION BOX WITH A DECREASED HEIGHT SIZE AND WATERPROOF FUNCTION

CROSS-REFERENCE TO RELATED APPLICATION

This application claims priority from Japanese Patent Application No. 2007-289739 filed on Nov. 7, 2007, the entire contents of which are incorporated herein by reference.

BACKGROUND

The present invention relates to an electrical junction box.

As shown in JP-A-2005-80370, there exists an electrical junction box has been known that includes a casing body including a bottom wall and a side wall, a circuit board contained in the casing body so that the circuit board is overlaid on the bottom wall, a filler filled in the casing body so that the filler embeds the circuit board, and a connector housing mounted on an upper edge of the casing body and adapted to be coupled to a mating member. The electrical junction box is mounted in, for example, a motor vehicle and performs on-off switching of on-vehicle electrical components such as lamps and audio devices.

SUMMARY

Recently, an electrical junction box with a low height is required in order to downsize an accommodating space in a motor vehicle. Consequently, for example, it has been contemplated to reduce a height size of a side wall from a bottom wall of the casing body and a distance between a connector housing mounted on an upper edge of the side wall and the bottom wall. This would be expected to reduce the whole height size of the electrical junction box.

However, if the height size of the side wall is reduced excessively, there is a possibility that a filler will leak out from a clearance between the side wall and the connector housing and a waterproof function of the electrical junction box will be lowered, even if the filler is filled to a given level of height in the connector housing.

In view of the above problems, an object of the present embodiment of the invention is to provide an electrical junction box that can decrease a height size and can maintain a waterproof function.

An electrical junction box in accordance with the present invention comprising a casing body including a bottom wall and a side wall extending upward from the bottom wall; a circuit board contained in the casing body; a connector housing disposed in a cutout section in the side wall and adapted to be coupled to a mating member; a filler filled in a space enclosed by the bottom wall, side wall and connector housing; and a seal member disposed in a clearance between the cutout section and an outer peripheral surface of the connector housing to seal the clearance.

According to the present invention, since the connector housing is accommodated in the cutout section in the side wall of the casing body, it is possible to decrease a height size of the electrical junction box.

Also, since the seal member is interposed between the cutout section and the connector housing, it is possible to prevent the filler from leaking out from the connector housing.

It is preferable that an embodiment of the electrical junction box in accordance with the present invention has the following constructions.

The seal member may be a packing. The packing may be accommodated in a receiving groove provided in at least one of the cutout section and the outer peripheral surface of the connector housing so that the packing is brought into close contact with an inner wall of the receiving groove and so that the packing is brought into contact with the other one out of the cutout section and the outer peripheral surface of the connector housing.

According to the above structure, since the packing is contained in the receiving groove provided in at least one of the cutout section and the outer peripheral surface of the connector housing so that the packing is brought into close contact with an inner wall of the receiving groove and so that the packing is brought into contact with the other one out of the cutout section and the outer peripheral surface of the connector housing, it is possible to seal a clearance between the cutout section and the outer peripheral surface of the connector housing. Thus, for example, in comparison with the case where an adhesive is used as the seal member, it is possible to enhance efficiency in workability, since a period in time for hardening the adhesive is not required.

The receiving groove may be provided in only an area opposed to the cutout section and the outer peripheral surface of the connector housing. The packing may be formed into a stick-like configuration. A length size of the packing may be set to be accommodated in the receiving groove.

According to the above structure, for example, in the case where the packing is mounted on a whole outer peripheral surface of the connector housing, it is possible to downsize the packing. Consequently, it is possible to lower a cost.

The receiving groove may be bent in a depth direction of the groove along the outer peripheral surface of the connector housing. Opposite ends of the packing may be accommodated in the receiving groove so that the opposite ends are bent in the depth direction of the groove along the inner wall of the groove. A depth size of the receiving groove at an area that accommodates the opposite ends of the packing may be set to be greater than a depth size of the receiving groove at an area that accommodates the other portions except the opposite ends of the packing.

Since the stick-like packing is contained in the receiving groove that is provided in the outer peripheral surface of the connector housing and is bent in a depth direction, the opposite ends of the packing is bent along the receiving groove in the depth direction. At this time, the packing is likely to recover its straight state due to its elastic force. That is, the opposite ends of the packing are displaced to a direction of spacing away from the bottom surface of the receiving groove. At this time, if the receiving groove is relatively shallow, there will be a possibility that the ends of the packing come out from the receiving groove.

According to the above structure, since the depth size of the receiving groove at the area that contains the opposite ends of the packing is set to be greater than the depth size at the area that contains the other portions except the opposite ends of the packing, it is possible to restrain the opposite ends of the packing from coming out from the receiving groove.

A cover for closing an opening edge of the side wall may be attached to the casing body. The cover may contact the casing body from a side opposite from the bottom wall so that the cover pushes the outer peripheral surface of the connector housing toward the cutout section.

According to the above structure, since the outer peripheral surface of the connector housing is pushed to the cutout section by the cover, it is possible to surely seal a clearance between the outer peripheral surface of the connector housing and the cutout section.

The connector housing may include a base portion, a hood portion provided on the base portion and adapted to be coupled to the mating member, and terminal metals passing through-holes in the base portion and disposed in the hood portion. The through-holes may be provided at a position higher than an upper surface of the filler.

According to the above structure, it is possible to prevent the filler from flowing into the through-holes. Consequently, since it is possible to prevent the filler from leaking from the through-holes through the hood portion to the outside of the electrical junction box, it is possible to eliminate, for example, a step of applying an adhesive having a waterproof function to the through-holes.

According to the present invention, it is possible to decrease a height size of the electrical junction box and to maintain a waterproof of the electrical junction box.

BRIEF DESCRIPTION OF THE DRAWINGS

Exemplary embodiments will be described below with reference to the drawings, wherein.

DETAILED DESCRIPTION OF EMBODIMENTS

Figure 1:
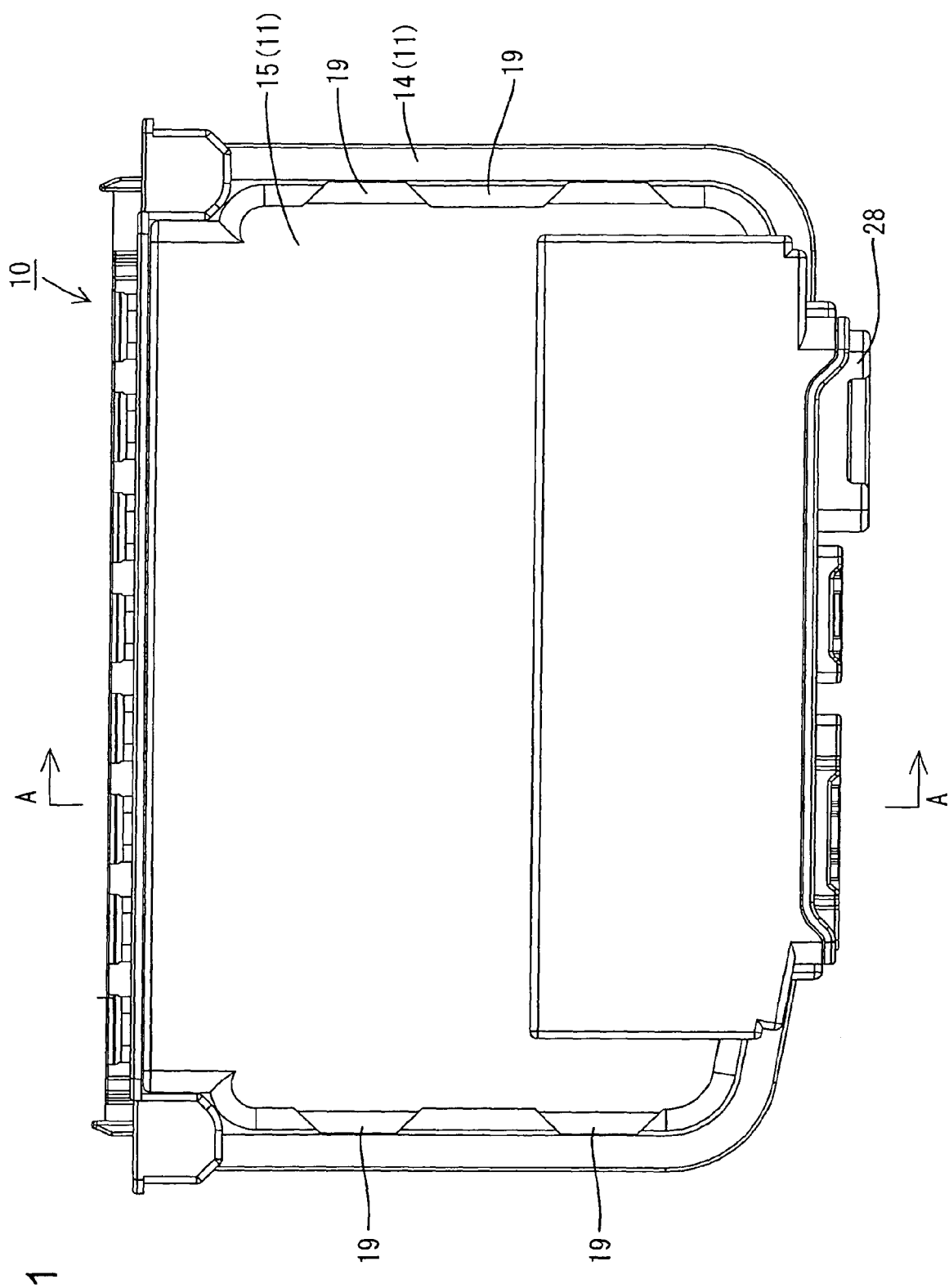
FIG. 1 is a plan view of an embodiment of an electrical junction box.

Embodiments of an electrical junction box in accordance with the present invention will be described below by referring to the drawings.

Figure 3:
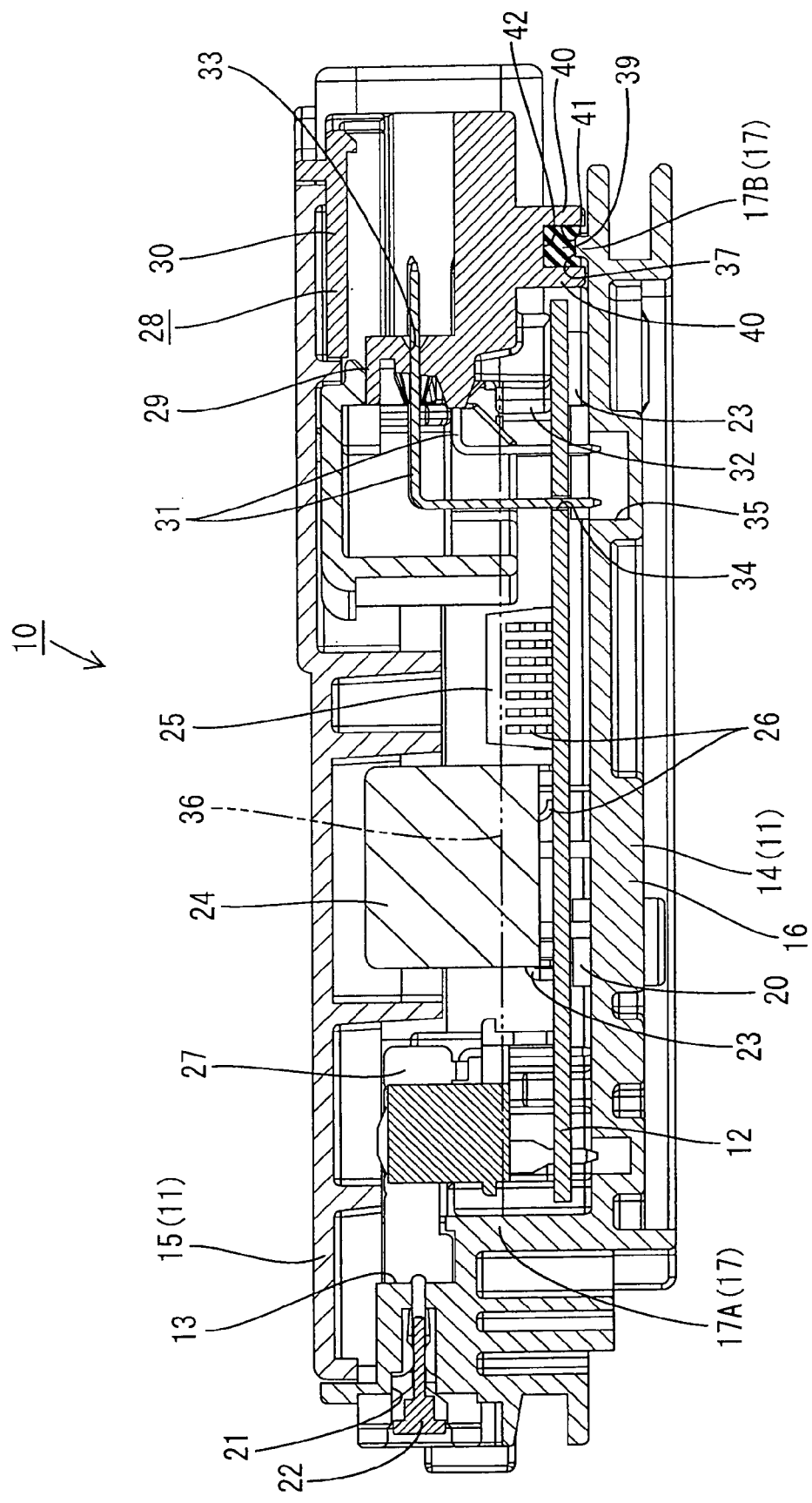
FIG. 3 is a cross section view of the electrical junction box taken along lines A-A in FIG. 1.

FIG. 1 illustrates an embodiment of an electrical junction box. The electrical junction box 10 is connected between a power source (not shown) such as a battery and on-vehicle electrical components (not shown) such as head lamps and wipers to switch on and off the on-vehicle electrical components. As shown in FIG. 3, the electrical junction box 10 contains a circuit board 12 in a flat casing 11. The casing 11 includes a casing body 14 made of a material such as synthetic resin and provided with an opening 13, and a cover 15 made of a material such as synthetic resin and adapted to close the opening 13.

The casing body 14 is formed into a shallow container and includes a bottom wall 16 and a side wall 17 extending upward from the bottom wall 16.

The cover 15 is attached to the casing body 14, when a plurality of lock portions 18 (FIG. 8) provided on an outer side surface of the side wall 17 of the casing body 14 are elastically engaged with a plurality of lock-receiving portions 19 (FIG. 2) provided on the cover 15 and at positions corresponding to the lock portions 18.

The casing body 14 is provided on the bottom wall 16 with support bosses 20 that project upward in FIG. 3 and support the circuit board 12 upward.

The casing body 14 is provided on a left side wall 17A out of the side wall 17 in FIG. 3 with a fuse-receiving portion 21 in the opening 13 directed to a left side in FIG. 3. A fuse 22 can be mounted in the fuse-receiving portion 21.

The circuit board 12 is mounted on upper surfaces of the support bosses 20 in FIG. 3 and is disposed above and spaced away from the bottom wall 16 to be overlaid on the bottom wall 16. The circuit board 12 and casing body 14 are secured to the support bosses 20 by bolts 23. Electrically conductive paths (not shown) are formed on the circuit board 12 by means of a printed wiring technique. For example, a thick layer board, in which a plurality of insulation plates provided with the electrically conductive paths are laminated, may be used as the circuit board 12. Lead terminals 26 for relays 24 and semiconductor relays 25 are electrically connected to the electrically conductive paths by, for example, soldering.

Figure 2:
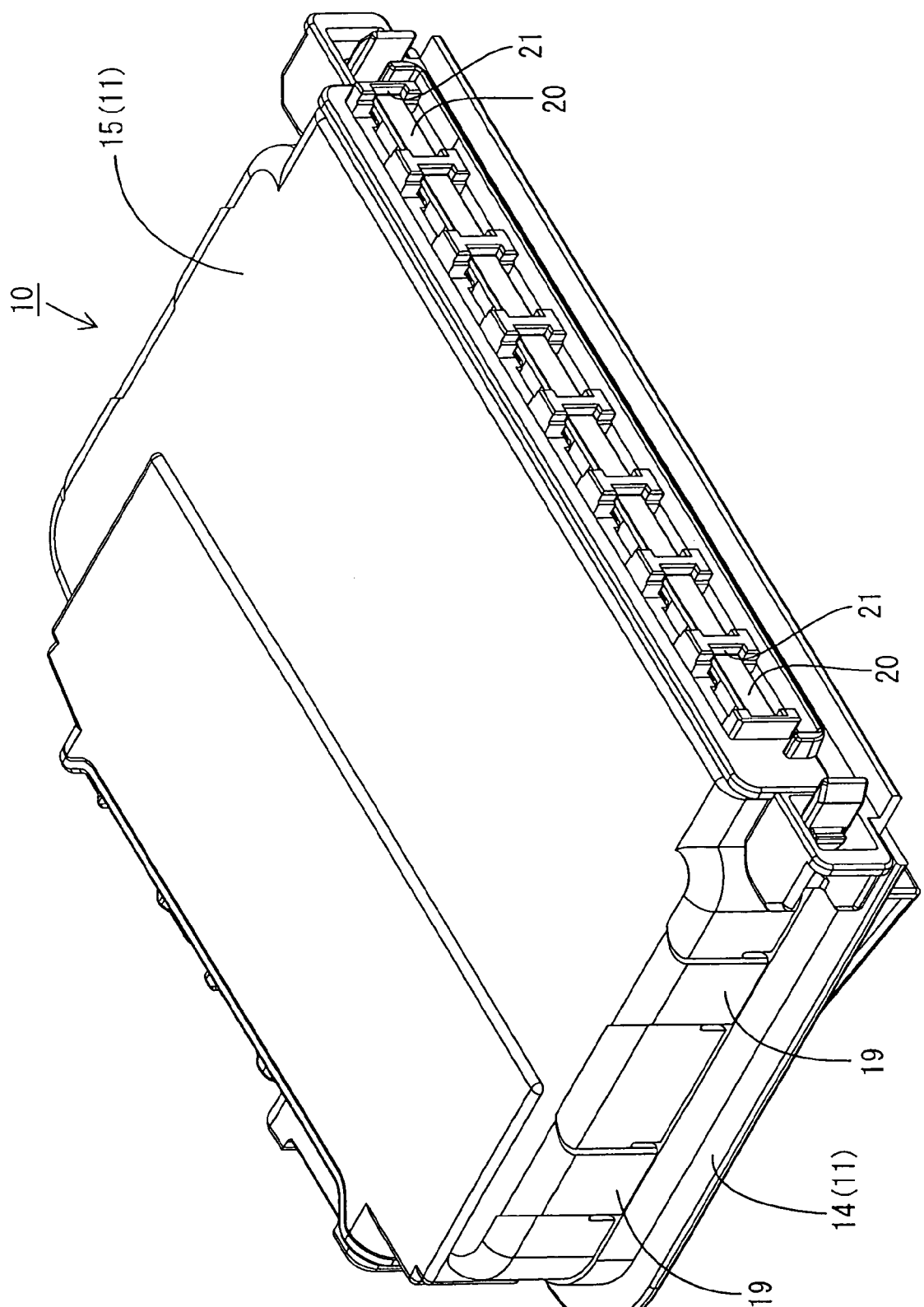
FIG. 2 is a perspective view of the electrical junction box shown in FIG. 1.

Fuse terminals 27 are disposed at a relatively left side in FIG. 2 on the circuit board 12. The fuse terminals 27 are juxtaposed on the circuit board 12 to extend in a direction perpendicular to the paper surface in FIG. 2. The fuse terminals 27 are formed by pressing a metal sheet, for example. An end of each fuse terminal 27 passes through-holes (not shown) in the circuit board 12 and is electrically connected to the electrically conductive paths by, for example, soldering.

The other end of each fuse terminal 27 extends in a left direction in FIG. 3 and is inserted into the fuse-receiving portion 21. When the fuse 22 is inserted into the fuse-receiving portion 21, the fuse 22 and fuse terminal 27 are electrically coupled to each other.

A connector housing 28 made of a material such as synthetic resin is disposed on the circuit board 12 at a relatively right side position in FIG. 3. In the present embodiment, the connector housing 28 serves as a board connector to be connected to the circuit board 12. The connector housing 28 includes a base portion 29, a hood portion 30 that is open from the base portion 29 to a right side in FIG. 1 and can be coupled to a mating connector (not shown, an example of a mating member), and terminal metals 31 that penetrates the base portion 29 in a lateral direction in FIG. 2 and projects into the hood portion 30.

Figure 6:
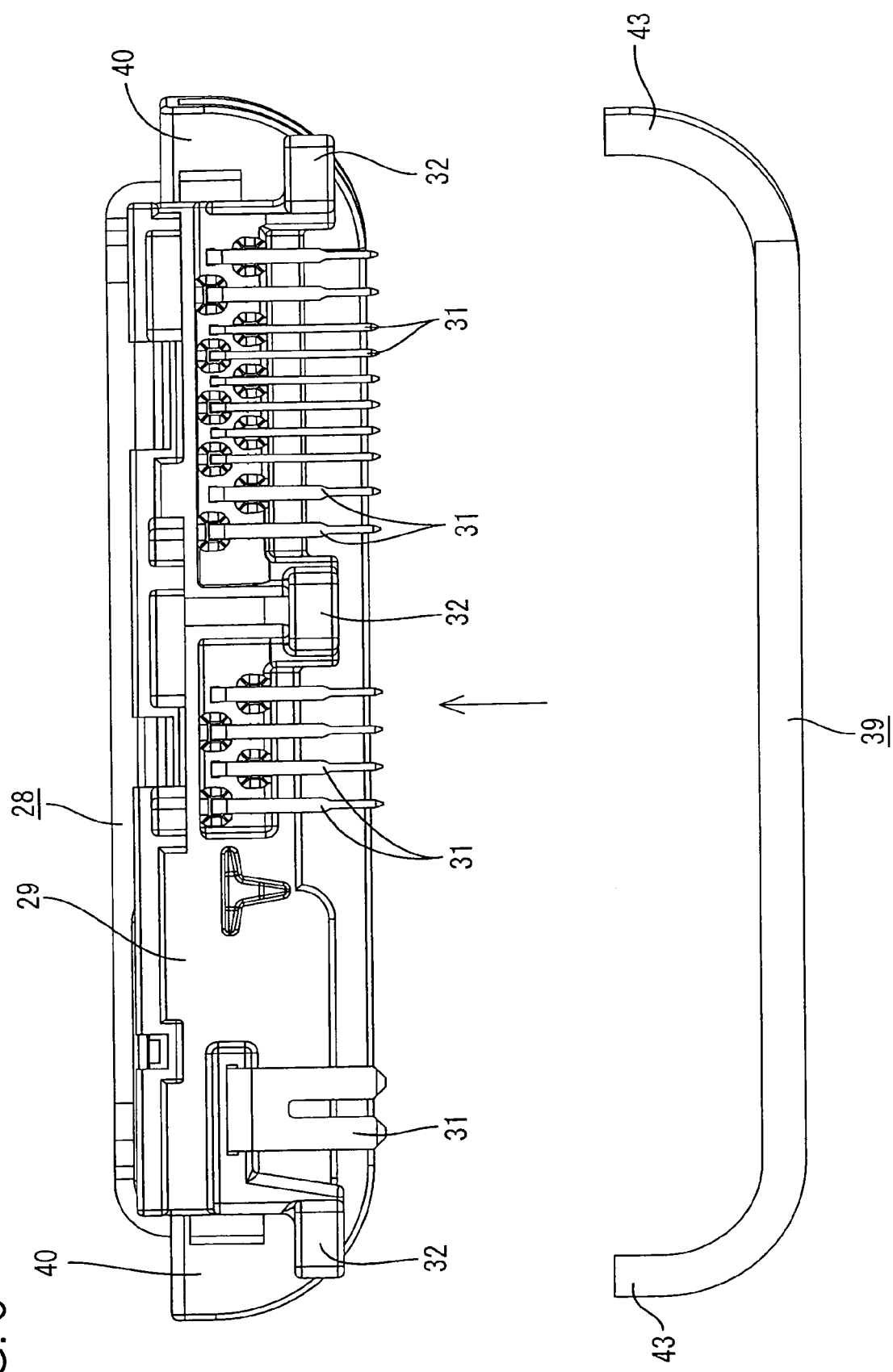
FIG. 6 is a front elevation view of a main part of the electrical junction box, illustrating the box in a state before a packing is attached to the connector housing.

As shown in FIG. 6, the connector housing 28 is provided with bolt-receiving portions 32 in which bolts 23 are screwed to pass through the circuit board 12 from a bottom surface of the circuit board 12. When the bolts 23 are screwed into the bolt-receiving portions 32, the connector housing 28 is secured to the circuit board 12.

The hood portion 30 is open at a right side in FIG. 3. A mating connector can be inserted into the hood portion 30 in a lateral direction in FIG. 3.

As shown in FIG. 3, the base portion 29 is provided with through-holes 33 extending laterally in the drawing. Each terminal metal 31 passes through each through-hole 33. A part of each terminal metal 31 that projects from the base portion 29 in FIG. 3 is bent downward perpendicularly to the circuit board 12, is inserted into each through-hole 34 in the circuit board 12, and is secured to the circuit board 12 by, for example, soldering to electrically connect the terminal metal 31 to the electrically conductive path on the circuit board 12. The terminal metals 31 are juxtaposed at two stages in a direction perpendicular to the paper surface in FIG. 6 and at a plurality of arrays in a lateral direction in FIG. 6.

The casing body 14 is provided on the bottom wall 16 at a position corresponding to each terminal metal 31 with a clearance recess 35 depressed downward in FIG. 3 and escaping from a distal end of the terminal metal 31.

As shown by a two-dot chain line in FIG. 3, a filler 36 is filled in a space enclosed by the bottom wall 16 and side wall 17 of the casing body 14 and the connector housing 28. The filler 36 may be, for example, an epoxy resin, a silicone resin or the like. The filler 36 is a liquid state when it is filled into the casing body 14. After the filler 36 is filled to a given level in height from the bottom wall 16 of the casing body 14, the filler 36 is coagulated.

The filler 36 is filled in the clearance recess 35 of the casing body 14 and a space between the circuit board 12 and the bottom wall 16 of the casing body 14. The circuit board 12 is embedded in the filler 36. Furthermore, the filler is filled to a level in height enough to cover the lead terminals 26 of the relay 24 and semiconductor relay 25. Thus, the filler 36 covers connected portions between the electrically conductive paths on the circuit board 12 and the lead terminals 26 of the relay 24 and semiconductor relay 25. The through-holes 33 in the base portion 29 are disposed above an upper surface of the filler 36.

Figure 4:
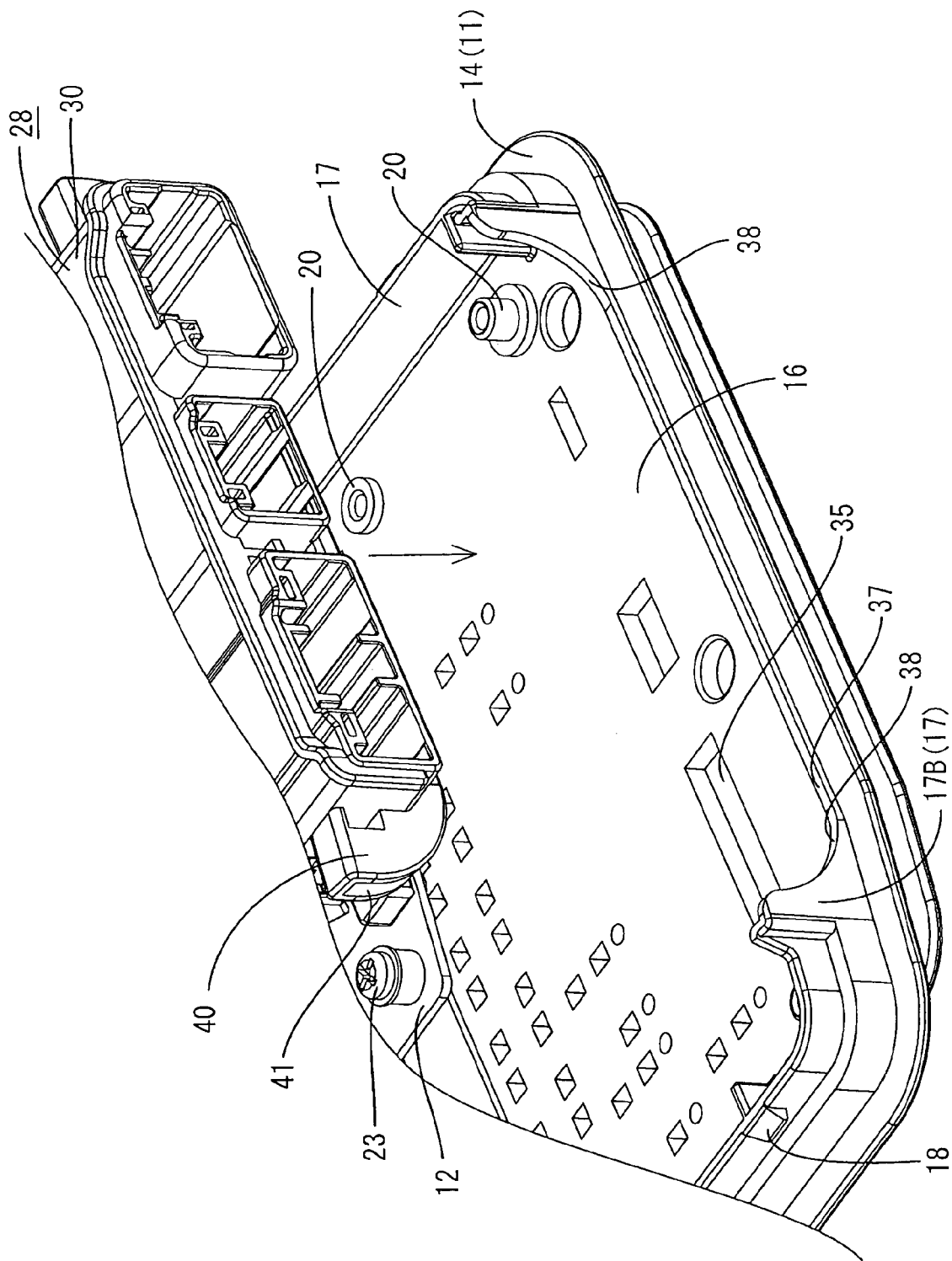
FIG. 4 is a perspective view of a main part of the electrical junction box, illustrating the box in a state before a connector housing is attached to a cutout section.

The connector housing 28 described above is attached to a right side wall 17B out of the side wall 17 of the casing body 14. The right side wall 17B defines an attaching wall 17B. As shown in FIG. 4, an open edge portion of the attaching wall 17B is removed downward in FIG. 4 (toward bottom wall 16) to define a cutout section 37. The connector housing 28 is disposed in the cutout section 37. An opening in the cutout section 37 is provided with a chamfer for guiding the connector housing 28. Two corners 38 of the cutout section 37 are formed into an arcuate shape at positions between side and lower edges of the cutout section 37.

Figure 7:
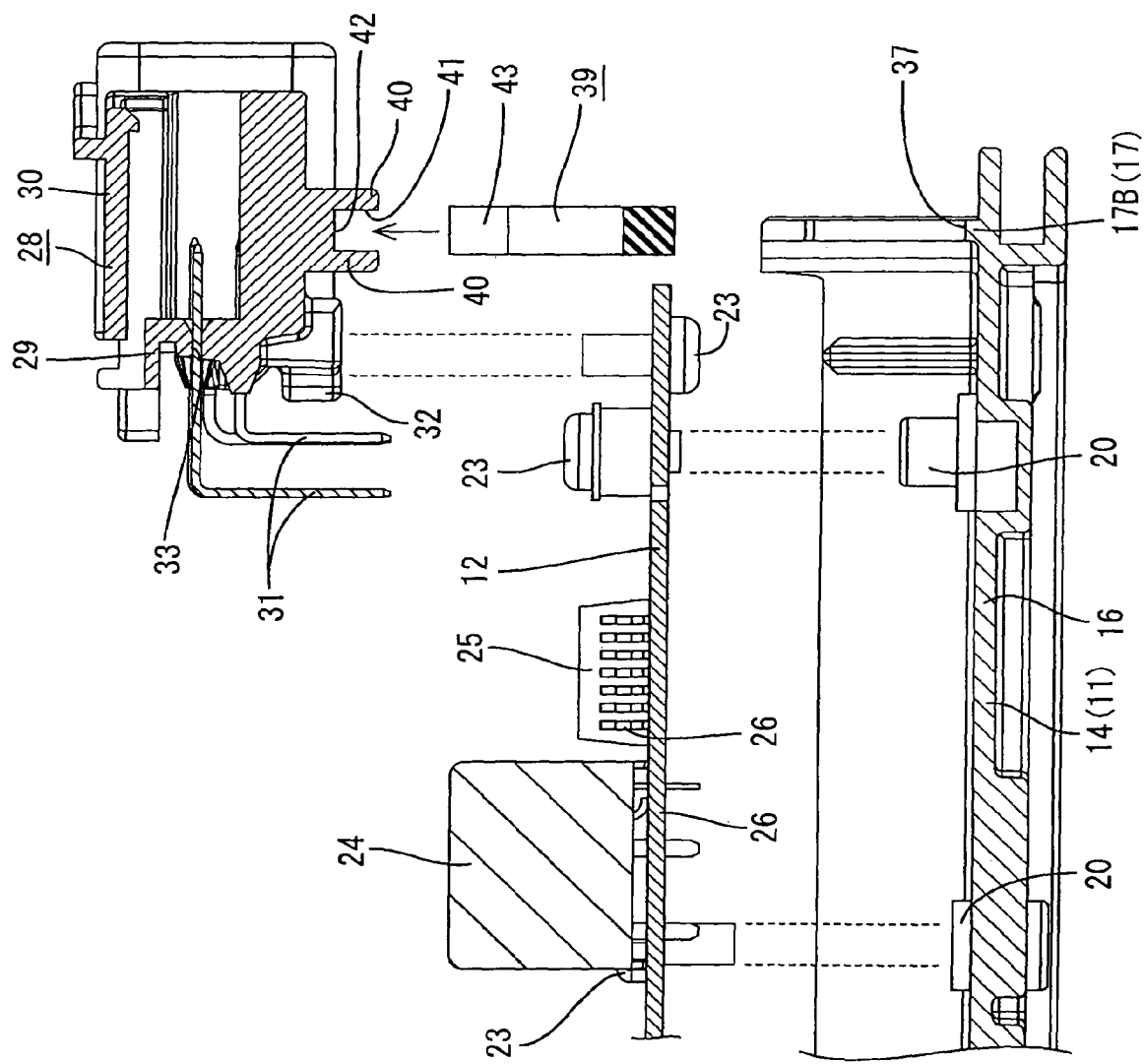
FIG. 7 is an enlarged and exploded side section view of a main part of the electrical junction box, illustrating a casing body, a circuit board, a connector housing, and a packing.
Figure 8:
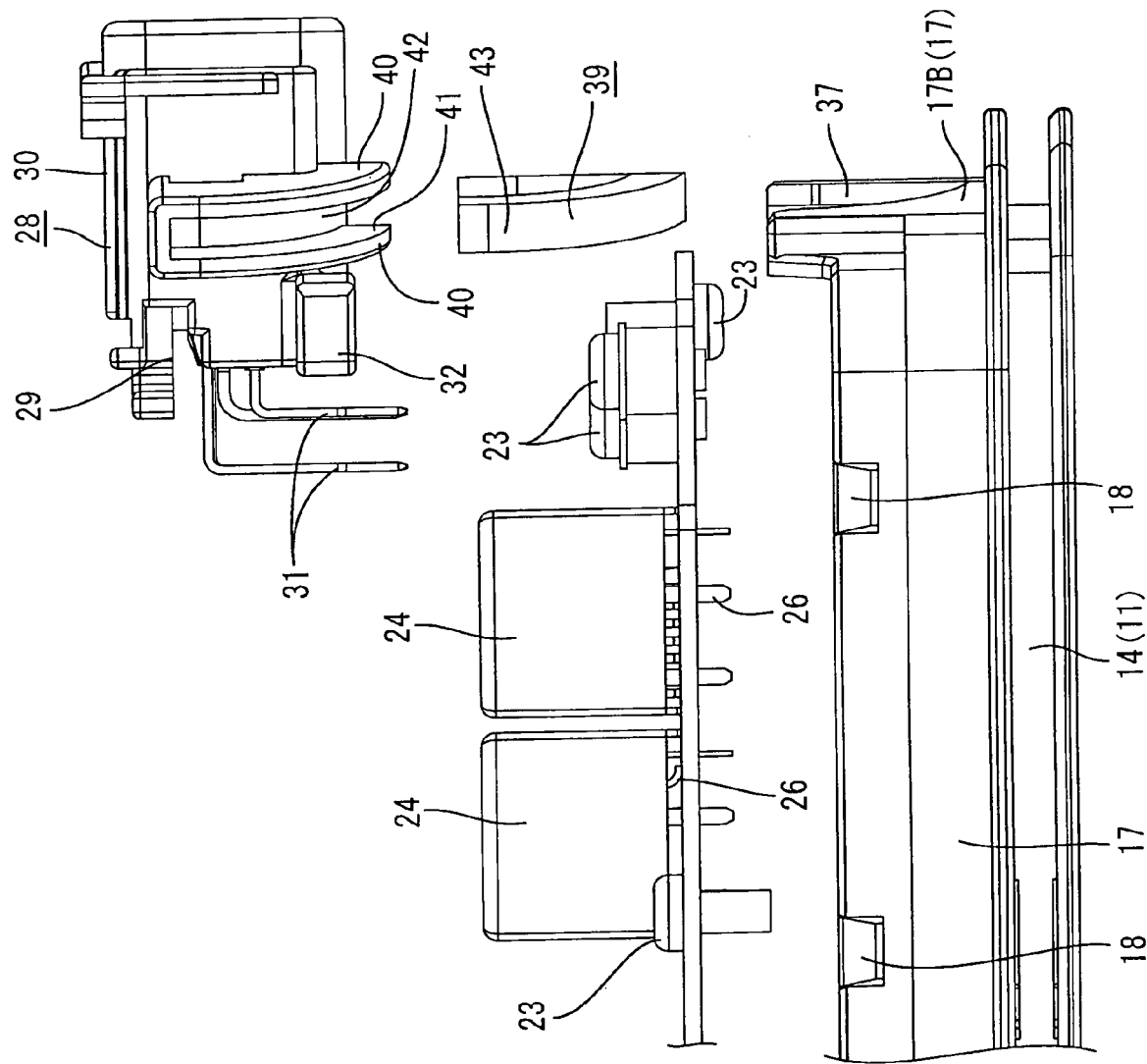
FIG. 8 is a an enlarged and exploded side elevation view of a main part of the electrical junction box, illustrating the casing body, circuit board, connector housing, and packing.

As shown in FIG. 3, a packing 39 (corresponding to a seal member) is interposed between the connector housing 28 and the cutout section 37. The packing 39 is made of an expanded rubber containing independent air bubbles. Since the expanded rubber is likely to absorb vibrations relatively, the packing 39 can absorb vibrations even if the vibrations are transmitted from a motor vehicle to the electrical junction box 10. Thus, it is possible to prevent an excessive force from being applied to soldered portions between the terminal metals 31 disposed in the connector housing 28 and the circuit board 12. As shown in FIGS. 6 to 8, the packing 39 is formed into a square stick having a rectangular cross section and an elongated length.

As shown in FIGS. 6 to 8, the connector housing 28 is provided on an outer periphery at an area opposed to the cutout section 37 with a projecting wall 40 that projects outward and covers the cutout section 37 when the connector housing 28 is attached to the cutout section 37. In more detail, the projecting wall 40 extends from a lower surface and right and left side surfaces of the base portion 29 of the connector housing 28 downward and laterally in FIGS. 5 and 6. An inner side of an area enclosed by the projecting wall 40 defines a receiving groove 41 for containing the packing 39 described above. The receiving groove 41 has a rectangle in cross section. A length size of the packing 39 is set to be accommodated in the receiving groove 41.

As shown in FIG. 3, the packing 39 is brought into close contact with an inner wall 42 of the receiving groove 41. The packing 39 is also brought into close contact with an end edge of the cutout section 37. Thus, a clearance between the outer peripheral surface of the connector housing 28 and the cutout section 37 is sealed.

As shown in FIG. 3, when the cover 15 is attached to the casing body 14, a right end edge of the cover 15 contacts an upper surface of the hood portion 30 of the connector housing 28 downward (toward the bottom wall 16 of the casing body 14). Thus, the cover 15 pushes the connector housing 28 downward (toward the cutout section 37).

Figure 5:
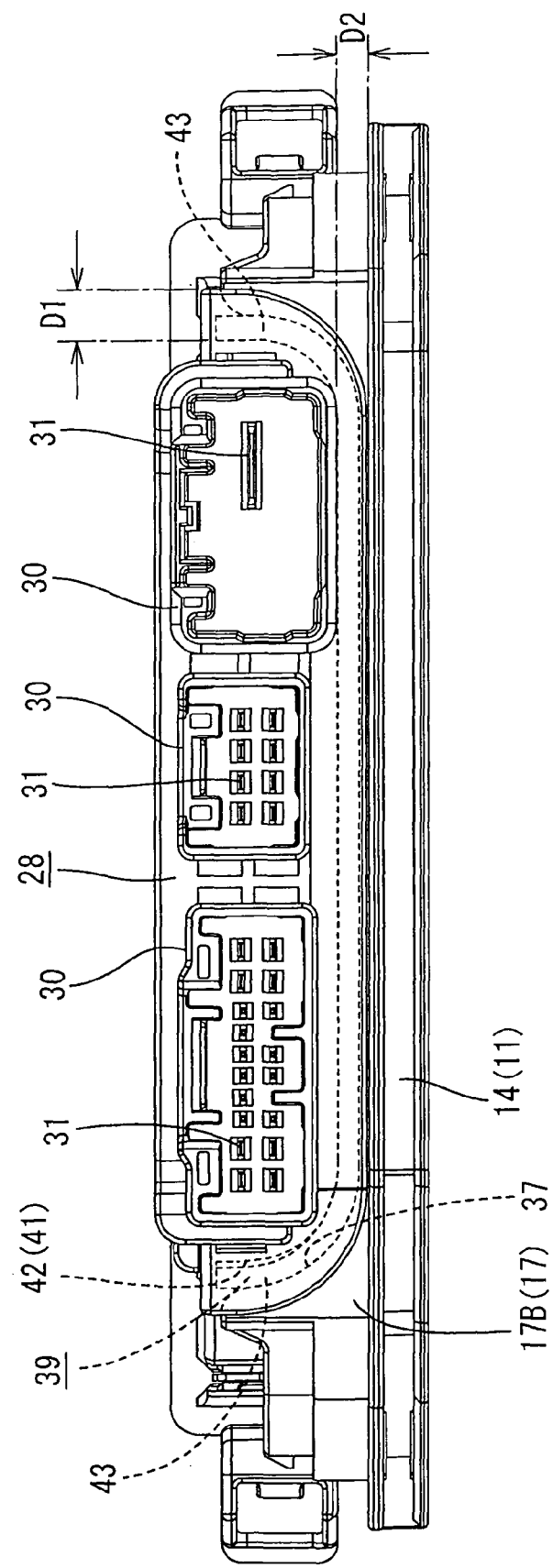
FIG. 5 is a front elevation view of the electrical junction box, illustrating the box in a state after the connector housing is attached to a casing body.

As shown in FIGS. 5 and 6, right and left ends 43 of the packing 39 are contained in the receiving groove 41 with the ends being bent upward in the drawings along the inner wall 42 of the receiving groove 41.

As shown in FIG. 5, a depth size D1 of the receiving groove 41 in an area for accommodating the opposite ends 43 of the packing 39 is set to be greater than a depth size D2 of the receiving groove 41 in an area for accommodating the other portions except the opposite ends 43 of the packing 39.

Next, operations and effects of the present embodiment will be described below. The lead terminals 26 in electronic elements such as the relay 24 and the semiconductor relay 25 are secured to the electrically conductive paths on the circuit board 12 by, for example, soldering. An end of each fuse terminal 27 is connected to each through-hole in the circuit board 12 by, for example, soldering.

Each of the terminal metals 31 is inserted into the base portion 29 of the connector housing 28. The other end of each terminal metal 31 projecting from the base portion 29 is bent. As shown by an arrow in FIG. 6, the packing 39 is contained in the receiving groove 41.

Each of the terminal metals 31 is inserted into each through-hole 34 in the circuit board 12. Then, the circuit board 12 and connector housing 28 are coupled to each other by bolts 23. Next, the terminal metals 31 and through-holes 34 in the circuit board 12 are connected to each other by, for example, soldering.

The casing body 14 is put on a vehicle body so that the bottom wall 16 is arranged horizontally. The circuit board 12 is mounted on the upper surfaces of the support bosses 20 of the bottom wall 16 and the circuit board 12 is accommodated in the casing body 14 so that the circuit board 12 is overlaid on the bottom wall 16.

At this time, as shown in FIG. 5, the cutout section 37 in the casing body 14 is inserted into the receiving groove 41 of the connector housing 28 so that the cutout section 37 contacts the packing 39 upward. The circuit board 12 is disposed in the casing body 14. Then, the circuit board 12 is secured to the casing body 14 by the bolts 23. Since the cutout section 37 pushes the packing 39 upward, the packing 39 and cutout section 37 are brought into close contact with each other. Furthermore, an elastic deformation of the packing 39 brings the packing 39 and the inner wall of the receiving groove 41 into close contact with each other. Thus, a clearance between the connector housing 28 and the casing body 14 are sealed.

A liquid filler 36 is injected from a position above the circuit board 12 into a space enclosed by the bottom wall 16 and side wall 17 of the casing body 14. After the filler 36 is filled to a level in height enough to cover the lead terminals 26 of electronic parts mounted on the circuit board 12, the casing body 14 is left as it is until the filler 36 coagulates.

Thereafter, the cover 15 is attached to the casing body 14. Thus, the electrical junction box 10 is completed. The electrical junction box 10 is attached to and used in a motor vehicle, for example, with the hood portion 30 of the connector housing 28 being directed downward.

As described above, according to the present embodiment, since the connector housing 28 is accommodated in the cutout section 37 in the side wall 17 of the casing body 14, it is possible to reduce a height of the electrical junction box 10, for example, in comparison with the case where the connector housing 28 is mounted on an upper edge of the side wall 17 of the casing.

In addition, since the packing 39 is interposed between the cutout section 37 and the connector housing 28, it is possible to prevent the filler 36 from leaking out. Thus, it is possible to maintain a waterproof function of the electrical junction box 10.

Since the stick-like packing 39 is contained in the receiving groove 41 that is provided in the outer peripheral surface of the connector housing 28 and is bent in a depth direction in the present embodiment, the packing 39 is bent along the receiving groove 41 in the depth direction. At this time, the packing 39 is likely to recover its straight state due to its elastic force. That is, the opposite ends of the packing 39 are displaced to a direction of spacing away from the bottom surface of the receiving groove 41. At this time, if the receiving groove 41 is relatively shallow, there will be a possibility that the opposite ends of the packing 39 come out from the receiving groove 41.

According to the present embodiment, since the depth size of the receiving groove 41 at the area that accommodates the opposite ends of the packing 39 is set to be greater than the depth size at the area that accommodates the other portions except the opposite ends of the packing 39, it is possible to restrain the opposite ends of the packing 39 from coming out from the receiving groove 41.

Furthermore, according to the present embodiment, since the outer peripheral surface of the connector housing 28 is pushed to the cutout section 37 by the cover 15, it is possible to surely seal a clearance between the outer peripheral surface of the connector housing 28 and the cutout section 37.

Also, according to the present embodiment, the receiving groove 41 is provided in only an area in which the outer peripheral surface of the connector housing 28 is opposed to the cutout section 37. The packing 39 is formed into a stick-like configuration. The length size of the packing 39 is set to be a size enough to be contained in the receiving groove 41. Thus, for example, in comparison with the case where the packing 39 is mounted on the whole outer peripheral surface of the connector housing 28, it is possible to downsize the packing 39. Consequently, it is possible to lower a cost.

According to the present embodiment, since the packing 39 is contained in the receiving groove 41 formed in the outer peripheral surface of the connector housing 28 with the packing being closely contacted with the bottom wall of the groove 41 and the packing 39 is brought into close contact with the cutout section 37, it is possible to seal the clearance between the cutout section 37 and the outer peripheral surface of the connector housing 28. Thus, for example, in comparison with the case where an adhesive is used as a seal member, it is possible to enhance efficiency in working since a period in time for hardening the adhesive is eliminated.

According to the present embodiment, the through-holes 33 in the base portion 29 of the connector housing 28 are provided on a position above the upper surface of the filler 36. Thus, it is possible to prevent the filler 36 from flowing into the through-holes 33. Consequently, since it is possible to prevent the filler from leaking out from the through-holes 33 through the hood portion 30 to the outside of the electrical junction box 10, it is possible to eliminate, for example, a step of applying an adhesive having a waterproof function to the through-holes.

It should be noted that the present invention is not limited to the embodiment described above and illustrated in the drawings. For example, the following embodiments will fall in the technical scope of the present invention.

(1) Although the packing 39 is used as a seal member in the present embodiment, the present invention is not limited to this embodiment. For example, the clearance between the outer surface of the connector housing 28 and the cutout section 37 may be sealed by applying an adhesive having water resistance to the clearance.

(2) Although the packing 39 is formed into the stick-like configuration in the present embodiment, the present invention is not limited to this embodiment. The packing 39 may be formed into an annular configuration and mounted on the outer peripheral surface of the connector housing 28.

(3) Although the depth size D1 of the receiving groove 41 at the area where the opposite ends of the packing 39 are contained in the groove 41 is set to be greater than the depth size D2 at the area where the other portions except the opposite ends of the packing 39 are contained in the groove 41 in the present embodiment, the present invention is not limited to this embodiment. The size in depth may be set to be uniform, if recovering deformation of the packing 39 is restrained by a temporary support for the packing 39, for example, a protrusion on the inner surface of the receiving groove 41.

(4) Although the terminal metals 31 pass the through-holes 33 in the connector housing 28 in the present embodiment, the present invention is not limited to this embodiment. The opening of the through-hole 33 at the opposite side from the hood portion 30 may be sealed by an adhesive having a waterproof function, with the terminal metals 31 passing the through-holes 33. Thus, it is possible to fill the filler 36 to the level in height above the through-hole 33.

(5) Although the receiving groove 41 is provided in the connector housing 28 in the present embodiment, the present invention is not limited to this embodiment. The receiving groove 41 may be provided in the cutout section 37 and the packing 39 may be received in the receiving groove 41.

What is claimed is:

1. An electrical junction box comprising:
    a casing body including a bottom wall and a side wall extending upward from the bottom wall, the side wall defining a cutout section;
    a circuit board contained in the casing body;
    a connector housing including a receiving groove for receiving and covering the cutout section of the side wall, the receiving groove defining an inner wall;
    a filler filled in a space enclosed by the bottom wall, the side wall and the connector housing; and
    a seal member disposed in the receiving groove adjacent to the inner wall of the receiving groove such that the seal member contacts the cutout section when the receiving groove covers the cutout section.

2. The electrical junction box according to claim 1, wherein the circuit board is overlaid on the bottom wall and the filler embeds the circuit board.

3. The electrical junction box according to claim 2, wherein the connector housing includes a base portion, a hood portion provided on the base portion and adapted to be coupled to a mating member, and terminal metals passing through-holes in the base portion and disposed in the hood portion, the through-holes are provided at a position higher than an upper surface of the filler.

4. The electrical junction box according to claim 2, wherein the receiving groove is provided on an outer peripheral surface of the connector housing in only an area opposed to the cutout section.

5. The electrical junction box according to claim 4, wherein the connector housing includes a base portion, a hood portion provided on the base portion and adapted to be coupled to a mating member, and terminal metals passing through-holes in the base portion and disposed in the hood portion, the through-holes are provided at a position higher than an upper surface of the filler.

6. The electrical junction box according to claim 4, wherein the seal member is a packing formed into a stick-like configuration, and a length size of the packing is set to be accommodated in the receiving groove.

7. The electrical junction box according to claim 6, wherein the connector housing includes a base portion, a hood portion provided on the base portion and adapted to be coupled to a mating member, and terminal metals passing through-holes in the base portion and disposed in the hood portion, the through-holes are provided at a position higher than an upper surface of the filler.

8. The electrical junction box according to claim 6, wherein the receiving groove is bent in a depth direction of the receiving groove along the outer peripheral surface of the connector housing, opposite ends of the packing are accommodated in the receiving groove so that the opposite ends are bent in the depth direction of the receiving groove along the inner wall of the receiving groove, and a depth size of the receiving groove at an area that accommodates the opposite ends of the packing is set to be greater than a depth size of the receiving groove at an area that accommodates the other portions except the opposite ends of the packing.

9. The electrical junction box according to claim 8, wherein a cover for closing an opening edge of the side wall is attached to the casing body, the cover contacts the casing body from a side opposite from the bottom wall so that the cover pushes the outer peripheral surface of the connector housing toward the cutout section.

10. The electrical junction box according to claim 8, wherein the connector housing includes a base portion, a hood portion provided on the base portion and adapted to be coupled to a mating member, and terminal metals passing through-holes in the base portion and disposed in the hood portion, the through-holes are provided at a position higher than an upper surface of the filler.

11. The electrical junction box according to claim 2, wherein a cover for closing an opening edge of the side wall is attached to the casing body, the cover contacts the casing body from a side opposite from the bottom wall so that the covet pushes the receiving groove of the connector housing toward the cutout section.

12. The electrical junction box according to claim 11, wherein the connector housing includes a base portion, a hood portion provided on the base portion and adapted to be coupled to a mating member, and terminal metals passing through-holes in the base portion and disposed in the hood portion, the through-holes are provided at a position higher than an upper surface of the filler.

13. The electrical junction box according to claim 4, wherein a cover for closing an opening edge of the side wall is attached to the casing body, the cover contacts the casing body from a side opposite from the bottom wall so that the cover pushes the outer peripheral surface of the connector housing toward the cutout section.

14. The electrical junction box according to claim 13, wherein the connector housing includes a base portion, a hood portion provided on the base portion and adapted to be coupled to a mating member, and terminal metals passing through-holes in the base portion and disposed in the hood portion, the through-holes are provided at a position higher than an upper surface of the filler.

15. The electrical junction box according to claim 6, wherein a cover for closing an opening edge of the side wall is attached to the casing body, the cover contacts the casing body from a side opposite from the bottom wall so that the cover pushes the outer peripheral surface of the connector housing toward the cutout section.

16. The electrical junction box according to claim 15, wherein the connector housing includes a base portion, a hood portion provided on the base portion and adapted to be coupled to a mating member, and terminal metals passing through-holes in the base portion and disposed in the hood portion, the through-holes are provided at a position higher than an upper surface of the filler.

17. An electrical junction box comprising:
a casing body including a bottom wall and a side wall extending upward from the bottom wall, the side wall defining a cutout section;
a circuit board contained in the casing body;
a connector housing including a receiving groove for receiving and covering the cutout section of the side wall, the receiving groove defining an inner wall;
a filler filled in a space enclosed by the bottom wall, the side wall and the connector housing; and
a seal member disposed in the receiving groove adjacent to the inner wall of the receiving groove such that the seal member contacts the cutout section when the receiving groove covers the cutout section,
wherein the connector housing includes a base portion, a hood portion provided on the base portion and adapted to be coupled to a mating member, and terminal metals passing through-holes in the base portion and disposed in the hood portion, the through-holes are provided at a position higher than an upper surface of the filler.

\* \* \* \* \*